United States Patent [19]

Nakagawa

[11] Patent Number: 5,183,800
[45] Date of Patent: Feb. 2, 1993

[54] INTERCONNECTION METHOD FOR SEMICONDUCTOR DEVICE COMPRISING A HIGH-TEMPERATURE SUPERCONDUCTIVE MATERIAL

[75] Inventor: Yasuhito Nakagawa, Nara, Japan

[73] Assignee: Sharp Kabushiki Kaisha, Osaka, Japan

[21] Appl. No.: 711,716

[22] Filed: Jun. 7, 1991

Related U.S. Application Data

[63] Continuation of Ser. No. 192,671, May 10, 1988, abandoned.

[30] Foreign Application Priority Data

Jul. 15, 1987 [JP] Japan ................... 62-176220

[51] Int. Cl.⁵ .................... H01L 21/28; H01L 21/324
[52] U.S. Cl. ......................... 505/1; 505/740; 505/742; 437/174; 437/189; 437/190; 437/195
[58] Field of Search ............... 505/740, 742; 437/189, 437/190, 192, 193, 194, 195, 173, 174

[56] References Cited

U.S. PATENT DOCUMENTS 4,507,852  4/1985  Karulkar ................. 437/192

FOREIGN PATENT DOCUMENTS

| | | | |
|---|---|---|---|
| 0094808 | 2/1982 | Japan . | |
| 60-154613 | 8/1985 | Japan . | |
| 0276812 | 11/1988 | Japan | 505/742 |
| 1017330 | 1/1989 | Japan | 505/742 |
| 0043916 | 2/1989 | Japan | 505/742 |
| 0043927 | 2/1989 | Japan | 505/742 |
| 1089589 | 4/1989 | Japan | 505/742 |
| 1100095 | 4/1989 | Japan | 505/742 |
| 1100096 | 4/1989 | Japan | 505/742 |
| 0114084 | 5/1989 | Japan | 505/742 |
| 0147878 | 6/1989 | Japan | 505/742 |

OTHER PUBLICATIONS

Robinson, "IBM Superconductor Leaps Current Hurdle" Research News, Jun. 5, 1987, p. 1189.
Ramirez, "Superconductors Get into Business," Fortune, Jun. 22, 1987, pp. 114–118.
Business Week Cover Story, "Superconductors", Apr. 6, 1987, pp. 94–100.
Moriwaki et al., "Electrical Properties of Superconducting $(La_{1-x}Sr_x)_2CuO_4$ and $Ba_2YCu_3O_{7-\delta}$ Thin Films", in High Temperature Super Conductors—Extended Abs., Apr. 23–24, 1987, pp. 85–87.
Rao et al., "Y-Ba-Cu-O superconding Films on Oxidized Silicon", Appl. Phys. Lett. vol. 52, No. 23, Jun. 6, 1988, pp. 1987–1988.
Weber et al., "Laser Processing and Characterization of High-Tc Superconductors", Mat. Res. Soc. Symp. Proc., vol. 99, 1988, pp. 631–634.
Mantese et al., "Rapid Thermal Annealing of High Tc Superconducting Thin Films Formed by Metalorganic Deposition," Appl. Phys. Lett., vol. 52, No. 19, May 9, 1988, pp. 1631–1633.
New Electronics, May 12, 1987, p. 30; P. Judge; "Superconductor Future Heats Up".
IEE Transactions on Magnetics, vol. MAG-23, No. 2, Mar. 1987, pp. 641–648, Tachikawa et al.
Japanese Journal of Applied Physics/Part 2; vol. 27, No. 2; Feb. 1988; pp. L231–L233.

Primary Examiner—Mary Wilczewski
Attorney, Agent, or Firm—Birch, Stewart, Kolasch & Birch

[57] ABSTRACT

An interconnecting method for a semiconductor device which includes the steps of depositing a high-temperature superconductive material over an interlevel insulation layer, and irradiating an energy beam onto a high-temperature superconductive material layer thus formed by the above step so as to effect anneal treatment.

8 Claims, 3 Drawing Sheets

INTERCONNECTION METHOD FOR SEMICONDUCTOR DEVICE COMPRISING A HIGH-TEMPERATURE SUPERCONDUCTIVE MATERIAL

This application is a continuation of application Ser. No. 07/192,671, filed on May 10, 1988, now abandoned.

BACKGROUND OF THE INVENTION

The present invention generally relates to a semiconductor device and more particularly, to an improvement on an interconnection for a semiconductor device.

Recently, there has been remarkable progress in the field of semiconductor techniques, particularly, with respect to DRAM (Dynamic Random Access Memory) techniques which leads to improvements in silicon (Si) LSI (Large Scale Integration) techniques wherein a 4M DRAM will be put into actual application in the near future. Such VLSI is based on an MOS (Metal Oxide Semiconductor) technology using a process technology on the order of about 2 m to 1 m as a level for fine-pattern fabrication technology. A process technology along the order of a sub-micron region has already been brought into vigorous discussion. The fine-pattern fabrication technology processing, which has been pursued as a means for realizing higher integration and higher density, has inevitably brought about higher performance and higher speed of the MOS device. Gate delay time below 1 ns, which was conventionally considered to be realized by only bi-polar devices, is now at the stage of actual application. However, considering the delay time of an MOS device, there may be included delay time at input/output portions, delay time at interconnections, etc., along with the gate delay time. The delay time at the interconnection is especially increasing with the increase in chip dimensions following larger scale integration, thus hindering the effective reduction of the total delay time for the MOS device.

Similar problems, as referred to above, are also present in a GaAs LSI technology, which is expected to function at a speed higher than that of the Si LSI technology. Meanwhile, since the GaAs LSI is to be driven at a lower voltage and a larger current than the Si LSI technology, potential rising or falling on the interconnection due to the interconnection resistance (particularly, in the interconnection such as a power source line, etc. through which a large current flows) tends to occur, thus resulting in the deterioration of various characteristics.

Accordingly, investigation has begun into replacement of the interconnection material, from metal to a superconductive substance in which electrical resistance is reduced to zero under certain conditions.

The material currently under study for use as an interconnection material of a semiconductor is a high-temperature superconductive material (e.g. of Y-Ba-Cu-O group, etc.) having a critical temperature, in which electrical resistance becomes 0, in the vicinity of the temperature of liquid nitrogen (77K) or in a temperature region higher than that.

However, the high-temperature superconductive material as referred to above does not generally show superconductive characteristics unless it is subjected to sintering for several hours at high temperatures close to 1000° C. Since active elements such as transistors and the like will have already been formed on a semiconductor substrate, heat treatment at such a high temperature is undesirable because the transistors, etc. deteriorate or become destroyed by the heat.

More specifically, in order to form interconnections for a semiconductor device of a high-temperature superconductive material with an interconnection resistance close to 0, it is necessary to lower the heat treating temperature of the material at the vapor deposition step, or thereafter. It is preferable that the heat treating temperature should be lowered to about 400° C. or thereabout, although it may differ depending on the kinds of the semiconductor substrates.

Sputtering processes, MBE (Molecular Beam Epitaxy) processes, etc., which are expected to be of promise for forming a thin film of a high-temperature superconductive material over a semiconductor substrate, are extremely superior techniques with respect to alignment of crystal orientation. However, in both of these processes, since the vapor deposition is effected while the substrate is being heated at a temperature of approximately 800° C., lowering of the temperature is not sufficiently achieved as desired resulting in the possibility that for transistors, etc. may be degraded or destroyed.

SUMMARY OF THE INVENTION

Accordingly, an essential object of the present invention is to provide an interconnection method for a semiconductor device, in which active elements such as transistors, etc. formed in a lower semiconductor layer of the device are protected against degradation and destruction in the case where interconnections of a superconductive material are to be formed on an interlevel insulation layer.

Another object of the present invention is to provide an interconnection method of the above described type which may be readily introduced into a production line of the semiconductor device at low cost.

In accomplishing these and other objects, according to one preferred embodiment of the present invention, there is provided an interconnection method for a semiconductor device which includes the steps of deposition of a high-temperature superconductive material over an interlevel insulation layer and irradiation of an energy beam, such as a laser beam, electron beam or the like, onto a high-temperature superconductive material layer thus formed by the above step so as to effect an anneal treatment.

According to the above method of forming the semiconductor interconnect of the high-temperature superconductive material, the problems described earlier are advantageously solved by annealing the high-temperature superconductive material deposited at low temperature through irradiation of the laser beam, electron beam or the like. The above-noted method provides the advantages of superconductive characteristics and alignment of crystal orientation with attention being directed to the fact that transistors, etc. formed on a substrate of the semiconductor device are protected against degradation and destruction due to the nature of the anneal step performed via irradiation of such a laser beam, electron beam, etc.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become apparent from the following description taken in conjunction with the preferred embodiment thereof with reference to the accompanying drawings which are given by way of illustration only, and thus are not limitative of the present invention, and wherein.

DETAILED DESCRIPTION OF THE INVENTION

Figure 1A:
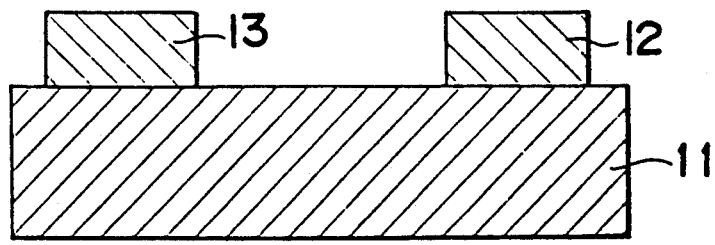
FIGS. 1(a) to 1(f) are schematic cross sections respectively showing steps of an interconnection method for a semiconductor according to one preferred embodiment of the present invention.

Before the description of the present invention proceeds, it is to be noted that like parts are designated by like reference numerals throughout the accompanying drawings.

Referring now to the drawings, there are shown in schematic cross sections of FIGS. 1(a) to 1(d), steps of an interconnection method for a semiconductor device according to one preferred embodiment of the present invention.

It is to be noted here that, in the drawings to be referred to hereinafter, the case where first level metals are connected by a high-temperature superconductive material will be taken as an example, with parts or portions other than necessary being omitted for brevity of the drawings.

In FIG. 1(a), a semiconductor substrate or base plate 11 has first level metals 12 and 13 formed thereon by a known process, with its lower semiconductor layer being formed with active elements (not shown) such as transistors or the like.

Figure 1B:
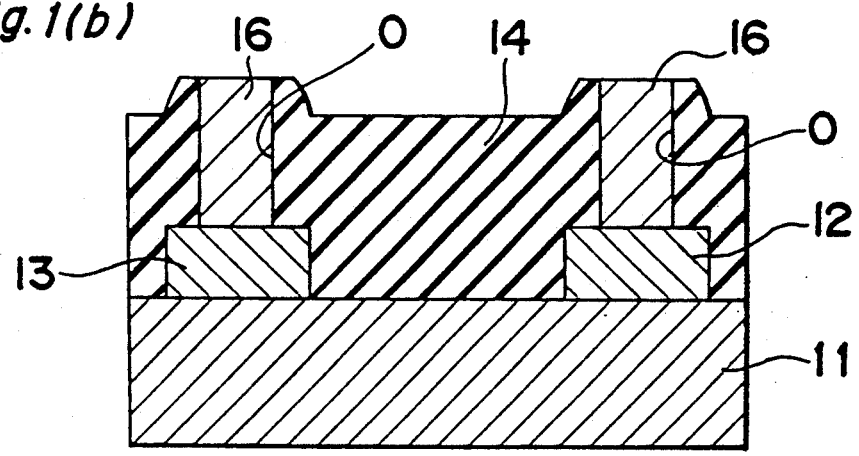

Thereafter, as shown in FIG. 1(b), an interlevel insulation layer 14, e.g. film of $SiO_2$ or the like formed by a CVD (chemical vapor deposition) process, is deposited over the substrate 11, having the construction as shown in FIG. 1(a), with a proper thickness and through-holes O for connecting the first level metals 12 and 13 with second layer interconnections formed in the film 14 as shown. The above interlevel insulation layer 14 is formed to have such a thickness as will supply sufficient heat to a high-temperature superconductive material during laser annealing, to be described later, while conducting only heat in a degree not causing degradation or destruction, to transistors, etc. to the lower semiconductor layer of the semiconductor device. Accordingly, the range for the optimum film thickness is varied by the annealing conditions such as by wavelength, irradiation intensity, irradiating time for the like. It should be noted here that, in the present embodiment, although the above through-holes O are adapted to be filled in by a metallic material 16, they may be left open depending on process integration.

Figure 1C:
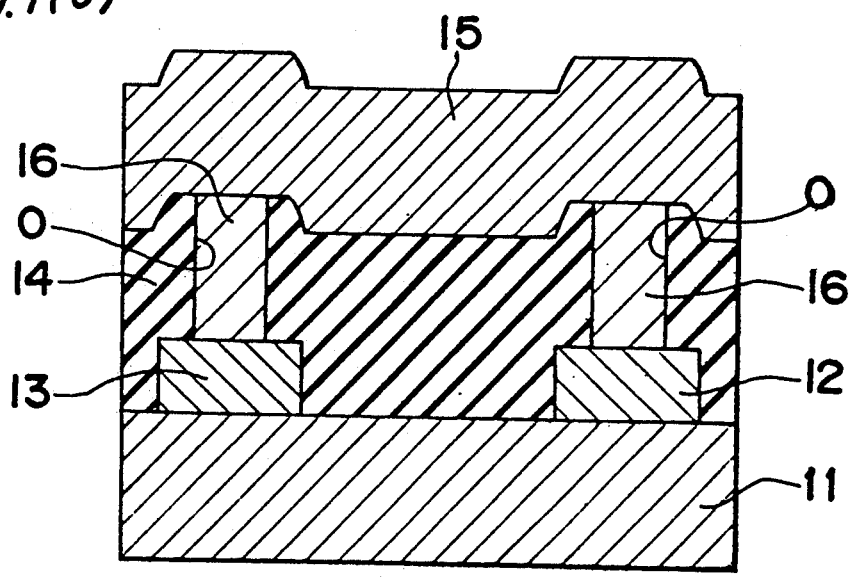

Then, as shown in FIG. 1(c), the high-temperature superconductive material 15 is deposited over the entire surface of the semiconductor substrate 11 by any arbitrary method such as sputtering, EB vapor deposition, resistance heating deposition or the like, and although it is not necessary to heat the substrate 11 in this case, the superconductive material is deposited at a composition ratio which will provide superconductive characteristics after laser annealing. It is to be noted that this ratio is also varied by the annealing conditions.

Subsequently, by laser annealing, the high-temperature superconductive material 15 deposited over the entire surface of the semiconductor substrate 11 is heat-treated so as to align the crystal orientation as well as to provide superconductive characteristics at the same time. This is a practice in which the annealing characteristic of laser irradiation, etc. is utilized. In other words, in laser annealing, a short time irradiation in the range of a nano second unit may be readily effected. It is therefore possible to complete the whole process of heating and cooling in a time period of a micro second unit, and thus, fast phenomena such as diffusion, segregation, crystal growth, etc. of impurity atoms in the fused material can be fully followed, without giving rise to slow phenomena such as diffusion of impurity atoms in a solid material. In this case, the crystallization of the fused layer and crystal axis orientation may be generally determined only by the annealing condition, without depending on the crystallinity of the ground material. Moreover, by making the thickness of the insulating layer film 14 most suitable for the annealing conditions, the above crystallization can be effected without degrading or destroying the transistors, etc. at the lower layer.

Figure 1D:
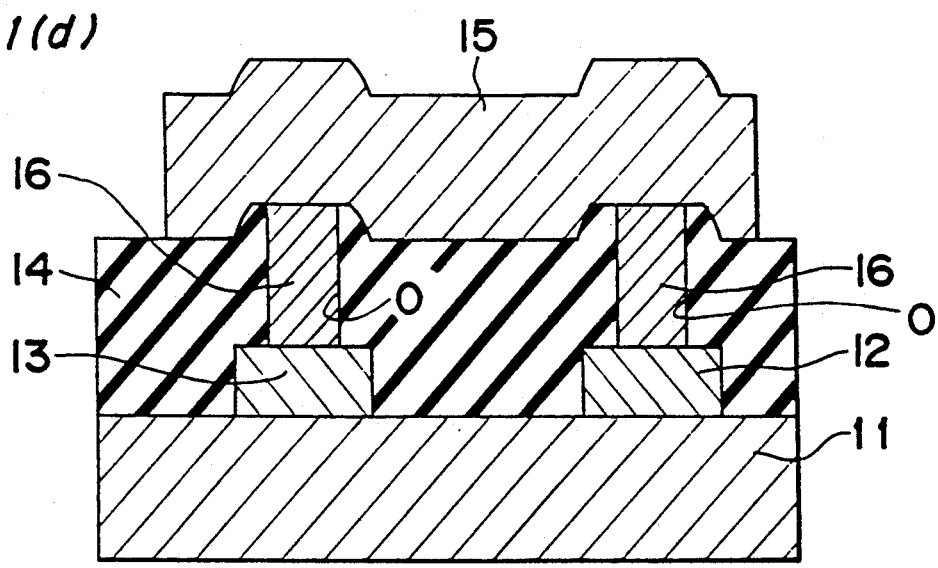

Finally, as shown in FIG. 1(d), unnecessary high-temperature superconductive material 15 is removed by etching, and thus, the semiconductor interconnection is completed.

By the steps as described above, the semiconductor interconnection in which electrical resistance becomes 0 under certain conditions may be formed by the superconductive material.

Furthermore, if the foregoing embodiment is further arranged as follows, the present invention becomes more effective.

Figure 2:
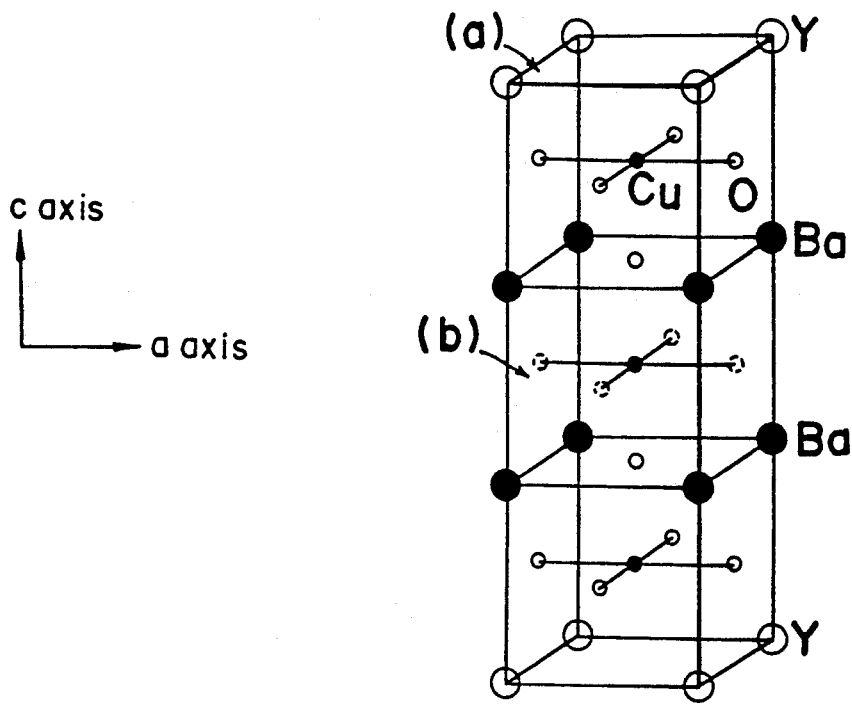
FIG. 2 is a diagram schematically showing one example of a crystal structure for a high-temperature superconductive material.
Figure 3:
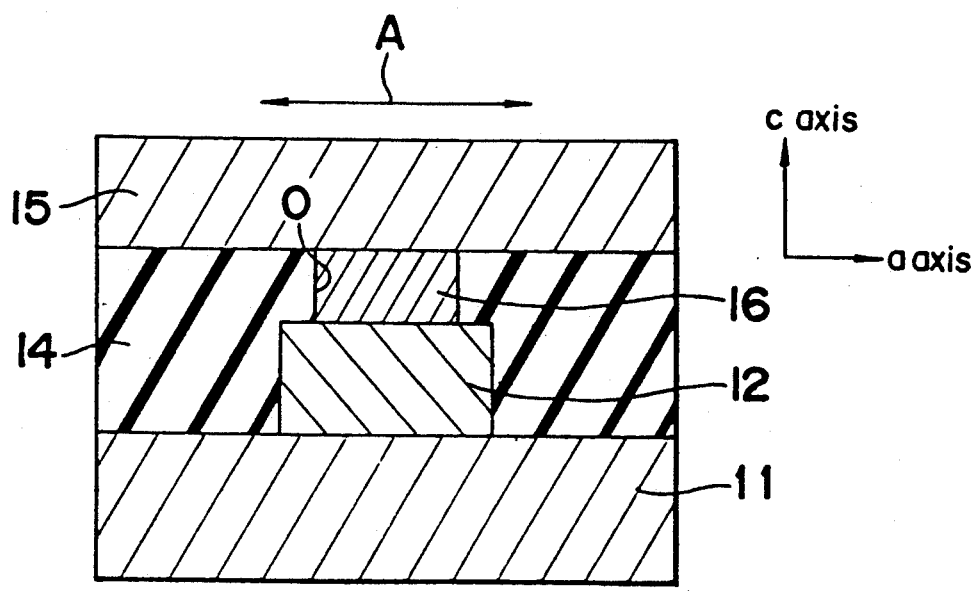
FIG. 3 is a schematic cross section detailing the relation between crystal orientation of the high-temperature superconductive material and interconnection orientation of the semiconductor device.

(i) The high-temperature superconductive material has a crystal structure, for example, as shown in FIG. 2, and since it is governed by the conduction in the a axis orientation due to such crystal structure, it is preferable that the semiconductor interconnection should have the current flowing direction A directed in a direction of the a axis as shown in FIG. 3.

Figure 1E:
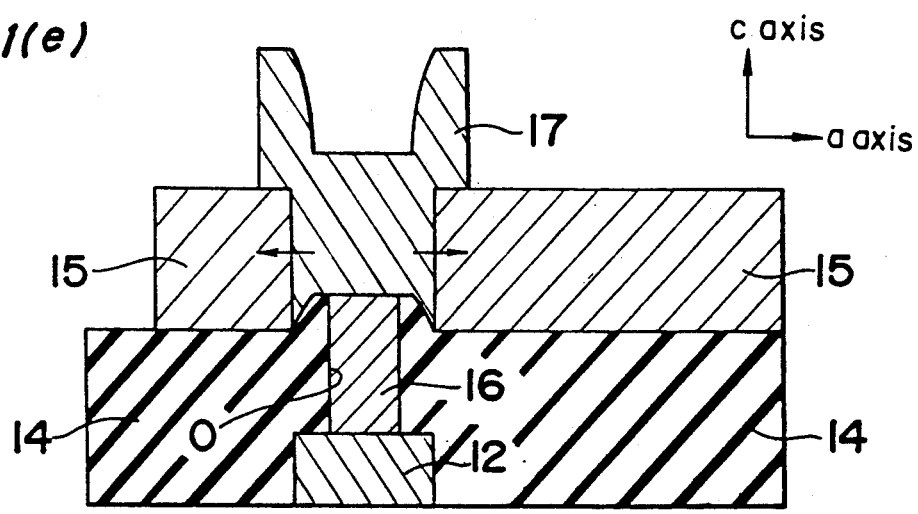

Accordingly, in a more preferred embodiment of the present invention, as shown in FIG. 1(e), after formation of the interconnection 15 of the superconductive material, contact is formed in a horizontal direction (in the a axis direction) by depositing a metallic material 17 through partial etching of the interconnection on the through-holes O. By the above construction, since the superconduction mainly takes place in the a axis direction, the current may be caused to flow into the interconnection 15 more effectively.

Figure 1F:
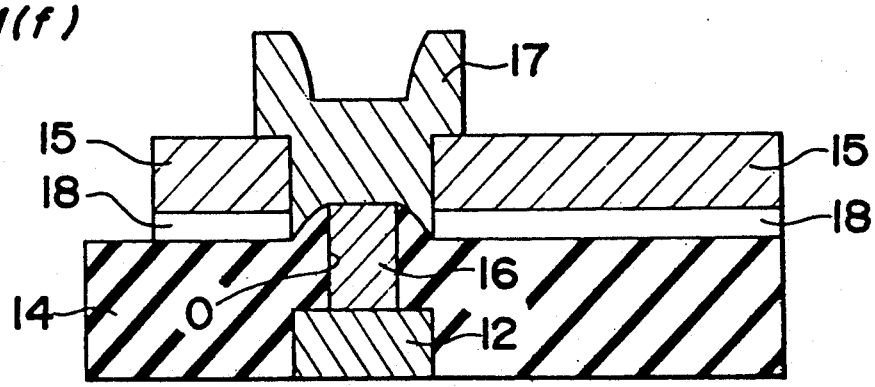

(ii) As shown in FIG. 1(f), by depositing another substance 18 of the perovskite group such as $SrTiO_3$, or the like, before deposition of the superconductive material 15, crystallization, etc. during laser annealing is facilitated. It is to be noted here that although $SrTiO_3$ is a superconductive substance, it has an increased resistance if used at the liquid nitrogen temperature ($\sim 77K$) due to its low critical temperature ($\sim 30K$), and therefore, the substance should preferably be used together with the method of the above item (i).

As is clear from the foregoing description, according to the present invention, it is possible to form the semiconductor interconnection of a superconductive material in which the electrical resistance becomes 0 under certain conditions, and thus, degradation of the semiconductor devices such as the propagation delay time at interconnections etc. due to electrical resistance can be advantageously eliminated.

Although the present invention has been fully described by way of example with reference to the accompanying drawings, it is to be noted here that various changes and modifications will be apparent to those skilled in the art. Therefore, unless otherwise noted, such changes and modifications are not to be considered as a departure from the spirit and scope of the present invention, and should be construed as included therein.

What is claimed is:

1. An interconnection method for a semiconductor device comprising the steps of:
    depositing an interlevel insulation layer of predetermined thickness over a semiconductor substrate formed with a first level metal on a surface and active elements in a lower semiconductor layer;
    forming through-holes through the interlevel insulation layer for connecting the first level metal with a second level interconnection;
    depositing a metallic material within the through-holes;
    depositing a high-temperature superconductive material over the surface of the interlevel insulation layer and the metallic material;
    heat-treating the surface of the high-temperature superconductive material thus deposited over the interlevel insulation layer by laser annealing for imparting thereto superconductive characteristics and simultaneous alignment of crystal orientation; and
    removing unnecessary portions of the high-temperature superconductive material by etching,
    said step of depositing an interlevel insulation layer protecting the active elements from thermal damage caused by said step of heat treating by laser annealing.

2. An interconnection method for a semiconductor device comprising the steps of:
    forming active elements in a lower layer of a substrate of the semiconductor device;
    depositing a first metal layer on a surface of the substrate;
    depositing an interlevel insulation layer over the surface of the substrate;
    depositing a high-temperature superconductive material over the surface of the interlevel insulation layer;
    forming through-holes through the interlevel insulation layer and the high-temperature superconductive material;
    depositing a metallic material into the through-holes for connecting said first metal layer with the high-temperature superconductive material;
    superconduction occurring in a horizontal direction between the metallic material in the through-holes and the high-temperature superconductive material;
    irradiating an energy beam over the surface of the high-temperature superconductive material to effect an anneal treatment, the interlevel insulation layer protecting the active elements from thermal damage caused by said step of irradiating; and
    removing unnecessary portions of the irradiated high-temperature superconductive material.

3. An interconnection method for a semiconductor device comprising the steps of:
    forming active elements in a lower layer of a substrate of the semiconductor device;
    depositing an interlevel insulation layer over the surface of the substrate;
    depositing a superconductive layer of relatively low critical temperature and increased resistance over the surface of the interlevel insulation layer;
    depositing a relatively high-temperature superconductive material over the surface of the superconductive layer of relatively low critical temperature;
    the low critical temperature superconductive layer facilitating crystallization of said high-temperature superconductive layer during a subsequent anneal treatment;
    irradiating an energy beam over the surface of the high-temperature superconductive material to effect said anneal treatment, the interlevel insulation layer protecting the active elements from thermal damage caused by said step of irradiating; and
    removing unnecessary portions of the irradiated high-temperature superconductive material.

4. The interconnection method of claim 3 wherein said superconductive layer comprises an element of the perovskite group.

5. The interconnection method of claim 4 wherein said element comprises $SrTiO_3$.

6. A method of forming a superconductor integrated circuit comprising the steps of:
    forming active elements on a lower portion of a substrate of the semiconductor integrated circuit;
    depositing first level metals on a surface of the substrate, the first level metals serving as intermediate contacts of the active elements;
    depositing an interlevel insulation layer over the surface of the substrate including the first level metals;
    filling the through-holes with a metallic material;
    depositing a high-temperature superconductive material over the surface of the interlevel insulation layer and the metallic material;
    irradiating an energy beam over the surface of the high-temperature superconductive material to effect an anneal treatment, the interlevel insulation layer protecting the active elements from thermal damage caused by the step of irradiating; and
    removing unnecessary portions of the irradiated high-temperature superconductive material.

7. The method of forming a semiconductor integrated circuit of claim 6 and further comprising the steps of:
    removing designated portions of the high-temperature superconductive material over the through-holes; and
    depositing the metallic material into the removed designated portions of the high-temperature superconductive material.

8. The method of forming a superconducting integrated circuit of claim 7 and further comprising the step of:
    depositing a superconductive layer, of low critical temperature and increased resistance as compared with the high-temperature superconductive material, on the interlevel insulation layer prior to said step of depositing the high-temperature superconductive material,
    the superconductive layer facilitating crystallization of the high-temperature superconductive layer during said irradiating step.

* * * * *